United States Patent
Knecht et al.

[11] Patent Number: 5,959,503
[45] Date of Patent: Sep. 28, 1999

[54] VOLTAGE CONTROLLED OSCILLATOR TUNING BY METAL LID APERTURE SELECTION

[75] Inventors: Thomas A. Knecht, West Dundee; Glen O. Reeser, Palatine, both of Ill.

[73] Assignee: Motorola Inc., Schaumburg, Ill.

[21] Appl. No.: 09/036,225

[22] Filed: Mar. 6, 1998

[51] Int. Cl.[6] .............. H03B 5/18; H03B 1/00; H03J 5/24; H05K 5/03

[52] U.S. Cl. .............. 331/68; 331/44; 331/96; 331/105; 331/117 D; 331/108 D; 331/179; 29/593; 361/752

[58] Field of Search .............. 331/44, 67, 68, 331/96, 97, 103, 105, 117 R, 117 FE, 117 D, 108 D, 175, 179, 187; 29/593, 825; 361/752, 753, 816–818

[56] References Cited

U.S. PATENT DOCUMENTS 5,235,291  8/1993  Shiga ............................. 331/44
5,648,748  7/1997  Isida ............................. 333/246

*Primary Examiner*—David Mis
*Attorney, Agent, or Firm*—Brian M. Mancini; Gary J. Cunningham

[57] ABSTRACT

A method (100) for tuning a voltage controlled oscillator by changing electrical circuit parasitics includes a first step (102) of providing a voltage controlled oscillator circuit on a circuit board and a plurality of different metal lids each having different numbers, sizes and locations of holes. Each different lid presents a different electrical circuit parasitic to the voltage controlled oscillator. In a second step (104), the voltage controlled oscillator frequency is measured, and the frequency shift needed to achieve a desired operating frequency is calculated in a third step (106). In a fourth step (108), a lid is chosen that will present the parasitics needed to provide the amount of frequency shift needed. As a last step (110), the chosen lid is attaching to the circuit board to obtain the desired nominal operating frequency from the voltage controlled oscillator.

17 Claims, 4 Drawing Sheets

VOLTAGE CONTROLLED OSCILLATOR TUNING BY METAL LID APERTURE SELECTION

FIELD OF THE INVENTION

The present invention relates generally to voltage controlled oscillators used in frequency synthesizers in communication devices and, in particular, to adjusting the operating frequency of voltage controlled oscillators.

BACKGROUND OF THE INVENTION

Radio communication devices, such as portable telephones, require a stable operating frequency provided by a local oscillator. Typically, the frequency of a local oscillator is generated by a voltage controlled oscillator (VCO). The operating frequency of voltage controlled oscillators used in these portable telephones is strongly dependent on parts tolerances and manufacturing techniques.

In particular, the etching variations of microstrips defined on circuit boards of VCOs can cause large frequency shifts of up to 4%. Some prior art methods to adjust the operating frequency of VCOs have included; deforming coils, using trimmable capacitors and using variable inductors. These methods have the disadvantage of having the potential to change frequency in the field, either through a mechanical shock or through intentional physical adjustment.

Other more permanent prior art methods to adjust the operating frequency of VCOs have used cutting techniques to remove conductive material from the circuit traces or specially provided large area capacitors designed to be mechanically trimmed. The actual cutting action was provided by laser trimming, sand abrasion, or even using a Dremel™ tool. All of the above techniques use active trimming to achieve a desired frequency and require additional production machinery. In particular, laser trimming systems which are commonly used are very expensive. The mechanical trimming methods have high labor costs and are not repeatable.

There is a need for a VCO tuning method that is simple and passive. There is also a need for a tuning method that saves space in a VCO and does not introduce contaminants on top of the circuit board. In addition, there is a need for a tuning method that does not require expensive production machinery and provides high yield.

BRIEF DESCRIPTION OF THE DRAWINGS

FIG. 1 is a perspective views of a first lid with no apertures, in accordance with the present invention;

FIG. 2 is a perspective views of a second lid with one aperture, in accordance with the present invention;

FIG. 3 is a perspective views of a third lid with two apertures, in accordance with the present invention;

DETAILED DESCRIPTION OF THE PREFERRED EMBODIMENT

The present invention provides a VCO tuning method that is simple and passive. In addition, the tuning method does not require additional tuning elements which would take up space, and does not introduce contaminants on top of the circuit board. Moreover, the tuning method does not require expensive production machinery and provides high yield.

As is known in the art, a frequency output of a voltage controlled oscillator (VCO) is substantially determined by a LC tank circuit or resonator. A transmission line (microstrip stripline), which is the most sensitive element of the resonator, is comprised of a microstrip disposed on an upper surface of a circuit board. This microstrip provides the primary inductance for the resonator. A problem arises wherein the physical width of the microstrip varies due to chemical etching tolerances inherent in circuit board manufacturing.

In high volume circuit board manufacturing, the circuit boards are processed in large lots. This results in circuit boards within each lot being similar. In particular, the line widths of the microstrips defined during processing will be very similar among circuit boards within a lot. However, the line widths of circuit boards between lots can be very different.

The present invention solves this problem by providing different lid configuration for each lot wherein the particular lid configuration introduces a predetermined amount of parasitics to frequency compensate for changes in the microstrip line widths.

In operation, one or two circuit boards per lot are measured for frequency deviation from nominal. It is not necessary that every circuit board within a lot be measured since each board within a lot will be very similar. Then, a look-up table is consulted to determine which lid configuration is needed to correct for the frequency deviation of that lot. This provides a simple and passive method to tune for frequency. As a result, the present invention efficiently improves total yield.

Figure 1:
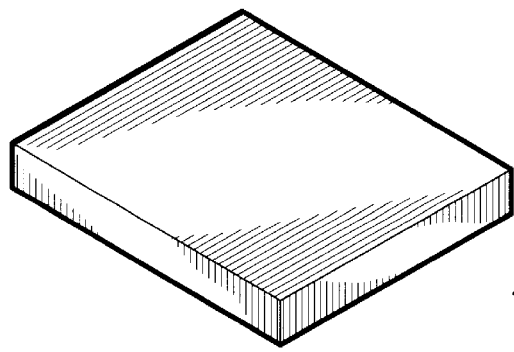
FIGS. 1–3 are perspective views of different metal lids to be used in accordance with the present invention.
Figure 2:
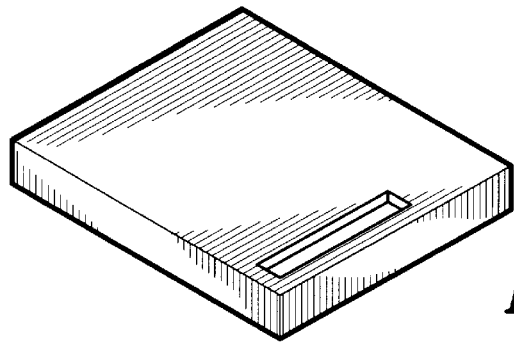
Figure 3:
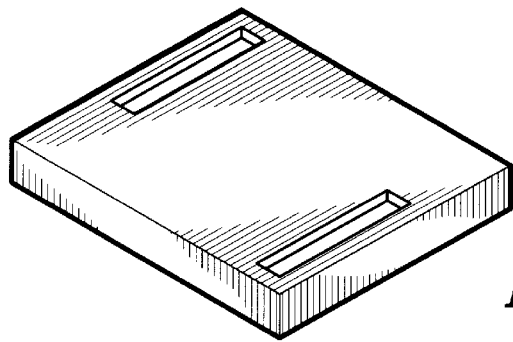
Figure 4:
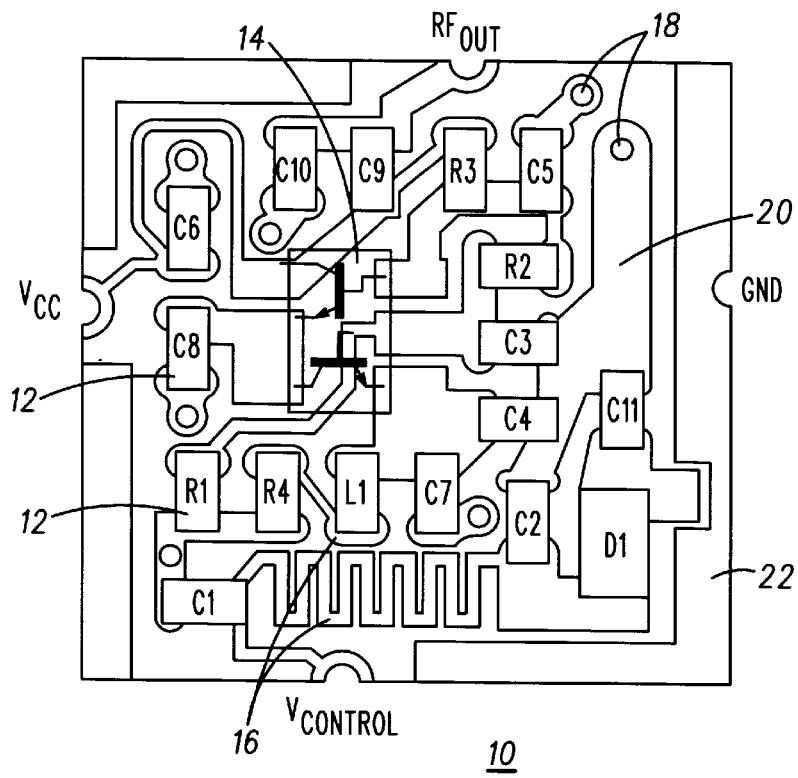
FIG. 4 is a top plan view of a circuit board with a VCO circuit, in accordance with the present invention.
Figure 9:
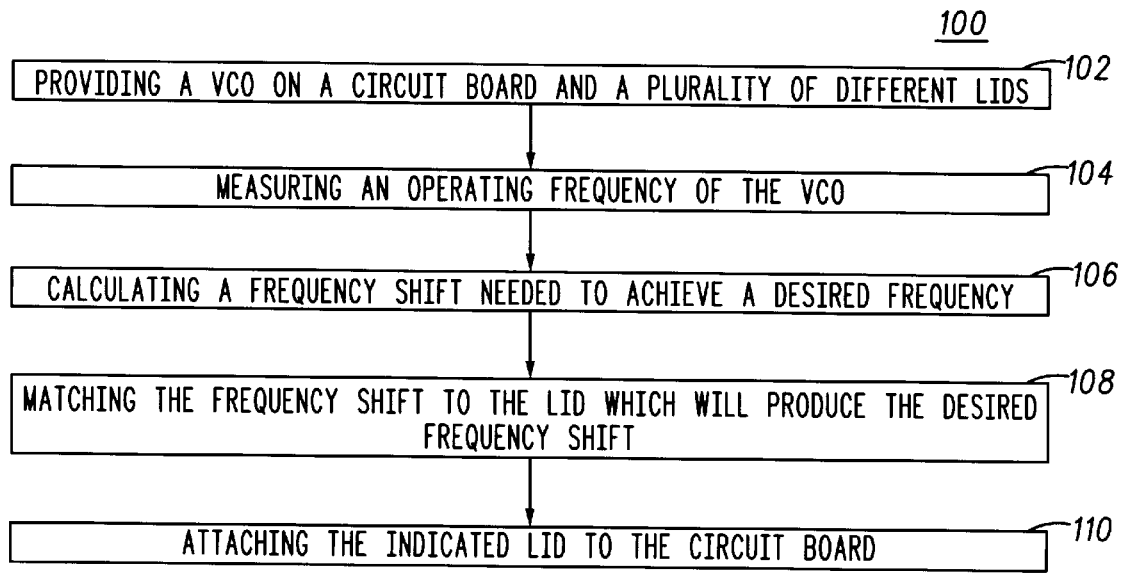
FIG. 9 is a block diagram of a simplified method to tune a VCO, in accordance with the present invention.

The present invention includes a method (see FIG. 9) for tuning a voltage controlled oscillator by changing its electrical circuit parasitics. The method 100 includes a first step 102 of providing a plurality of different metal lids each having different numbers, sizes and locations of apertures therethrough (as shown in FIGS. 1–3, for example), and providing a voltage controlled oscillator circuit on an upper side of a circuit board (as represented in FIG. 4). Each different lid presents a different electrical circuit parasitic to the voltage controlled oscillator circuit when attached to the upper surface of the circuit board.

A second step 104 of the method 100 includes measuring an operating frequency of the voltage controlled oscillator. The measuring step determines the operating frequency of the voltage controlled oscillator before it is tuned. Measuring frequencies of a voltage controlled oscillator can be performed by many techniques that are well known in the art and will not be presented here.

A third step 106 includes calculating an amount of frequency shift needed to achieve a desired nominal operating frequency. The calculating step includes taking the nominal operating frequency that is desired after the voltage controlled oscillator is tuned and subtracting the measured operating frequency of the voltage controlled oscillator obtained from the second step above, which typically results in a positive frequency shift.

A fourth step 108 includes matching the amount of frequency shift needed (from the calculating step) to values in a look-up table of predetermined frequency shifts versus different lids. The look-up table contains premeasured frequency shifts that occur for each different lid configuration due to each lid presenting different parasitic contributions to the voltage controlled oscillator circuit. Therefore, matching a needed frequency shift to a particular lid configuration determines which lid parasitic will provide the proper amount of frequency shift needed.

A last step 110 includes attaching the lid indicated in the matching step (108) above to the upper side of the circuit board to at least partially cover the voltage controlled oscillator circuit so as to present the appropriate parasitics to the voltage controlled oscillator circuit such that the desired nominal operating frequency is achieved.

FIGS. 1–3 show three lid configurations, for example, that can be provided in the providing step, although more or less configurations can be provided. The lids are conductive and are preferably metal for economy and RF shielding. FIG. 1 shows a first lid being defined by a continuous metal sheet forming sides and a top with no apertures therethrough. FIG. 2 shows a second metal lid with sides and a top with one aperture therethrough, and FIG. 3 shows a third metal lid with sides and a top with two apertures therethrough.

It is not required that the apertures or holes be evenly sized or located across from each other. Also, any numbers of apertures can be used as long as RF shielding of the VCO circuit is substantially maintained. The apertures of the lids of FIGS. 1–3 are only shown as an example. More apertures can be utilized. It is also not a requirement that the apertures be located near a periphery of a lid. However, it is preferred that the lid be connected to ground. The apertures can also be separately filled, sealed or covered using a substantially non-conductive material. For example, the oscillator could be filled with a potting material, as are known in the art, through one of the apertures.

In a preferred embodiment, the lids are 7.1 mm square with the apertures being 1 mm by 3.4 mm each, which provides the proper operation of the present invention while retaining appropriate RF shielding for the voltage controlled oscillator circuit.

FIG. 4 shows a top plan view of an assembled voltage controlled oscillator circuit 10. The circuit 10 includes chip components 12, transistors 14, inductors 16, connecting vias 18, and a microstrip 20, all assembled on a circuit board 22. The microstrip 20 is incorporated within the voltage controlled oscillator as part of a resonant LC circuit. As is known in the art, voltage controlled oscillators typically are utilized within a phase lock loop circuit in a frequency synthesizer (not shown) which provides a control voltage to Vcontrol of the VCO.

Figure 5:
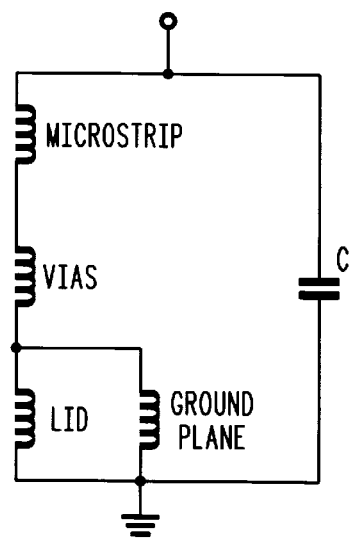
FIG. 5 is a simplified circuit model of a LC resonator of the VCO of FIG. 4, in accordance with the present invention.

FIG. 5 shows a simplified circuit model of an LC resonator of the voltage controlled oscillator of FIG. 4 after one of the lids of FIGS. 1–3 is attached. The capacitance, C, of the resonator is preferably provided by a chip capacitor. The metal lid and the ground are modeled in parallel with each other and in series with vias connecting portions of the circuit to a ground plane on a lower side of the circuit board.

Changing lids will change the total inductance of the LC circuit. Using a lid that lowers inductance will lower the inductance of the parallel connection of the lid and ground which in turn raises the resonant frequency of the LC resonator of the VCO. Using a lid that raises inductance will raise the inductance of the parallel connection of the lid and ground which in turn raises the resonant frequency of the LC resonator of the VCO. It should be recognized that although the vias are typically connected to ground it is to be understood that the vias could also be connected to a source or a combination of source and ground.

When attached to the circuit board, each lid presents a different parasitic inductance parallel to a ground plane of the circuit board of the voltage controlled oscillator circuit which reduces the effective inductance of an LC resonator in the voltage controlled oscillator circuit raising the operating frequency. The lids also present a parasitic capacitance (not shown) to each node of the voltage controlled oscillator circuit which increases the effective capacitance of an LC resonator in the voltage controlled oscillator circuit lowering the operating frequency.

The lids primarily present a parasitic inductance parallel to a ground plane of the circuit board of the voltage controlled oscillator circuit which reduces the effective inductance of an LC resonator in the voltage controlled oscillator circuit. The lids secondarily present a parasitic capacitance to each node of the voltage controlled oscillator circuit which increases the effective capacitance of an LC resonator in the voltage controlled oscillator circuit. The combination of parasitic inductances and capacitance typically results in an overall raising of the operating frequency.

In a preferred embodiment, the attaching step (110 of FIG. 9) includes coupling the lid to a ground plane of the circuit board using one of many techniques known in the art. For example, the lid can be solder reflowed to one or more ground connections of the circuit board. More particularly, the attaching step includes a ground plane substantially covering a lower side of the circuit board.

Figure 6:
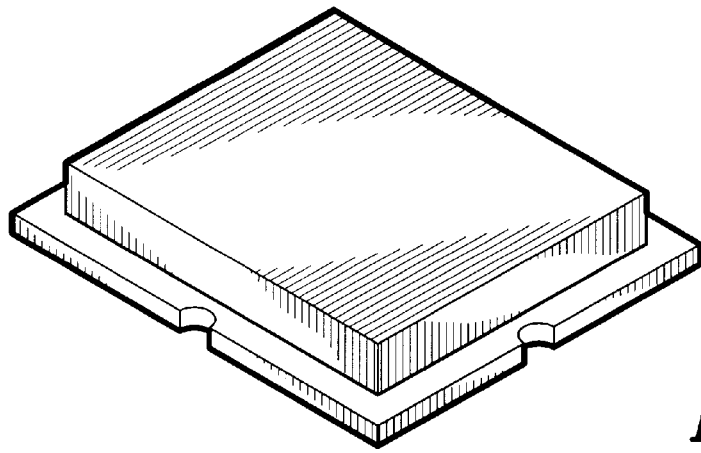
FIG. 6 is a perspective views of the VCO of FIG. 4 attached with the first lid of FIG. 1 attached, in accordance with the present invention.
Figure 7:
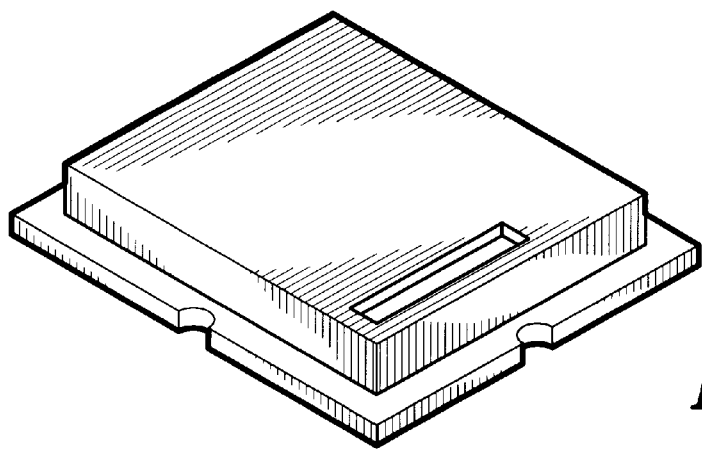
FIG. 7 is a perspective views of a VCO of FIG. 4 attached with the second lid of FIG. 2 attached, in accordance with the present invention.
Figure 8:
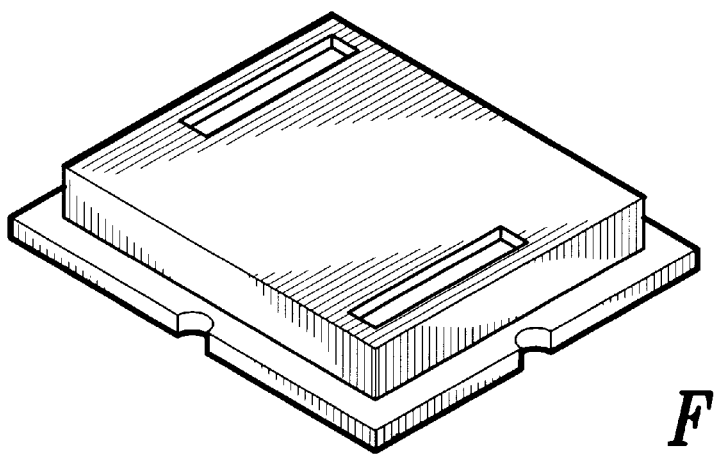
FIG. 8 is a perspective views of a VCO of FIG. 4 attached with the third lid of FIG. 3 attached, in accordance with the present invention.

FIGS. 6–8 shows the voltage controlled oscillator after the attaching step (110 of FIG. 9) using the different lid configurations of FIGS. 1–3, respectively.

In a preferred embodiment, the second lid (FIG. 2) is configured to statistically provide the desired nominal VCO operating frequency for the average circuit board lot. For those lots where the circuit boards have been overetched, producing microstrips with increased inductance, the first lid (FIG. 1) is chosen to be attached to all circuit boards in that lot in order to provide an decreased inductance to compensate for the increased stripline inductance. For those lots where the circuit boards have been underetched, producing microstrips with decreased inductance, the third lid (FIG. 3) is chosen to be attached to all circuit boards in that lot in order to provide an increased inductance to compensate for the decreased stripline inductance.

The novel method of the present invention provides a method of passively tuning a voltage controlled oscillator by changing electrical circuit parasitics. In addition, this method allows the use of a single circuit board configuration that can be used for a broad range of frequencies as opposed to supplying different circuit boards for each different VCO frequency.

EXAMPLE

Figure 10:
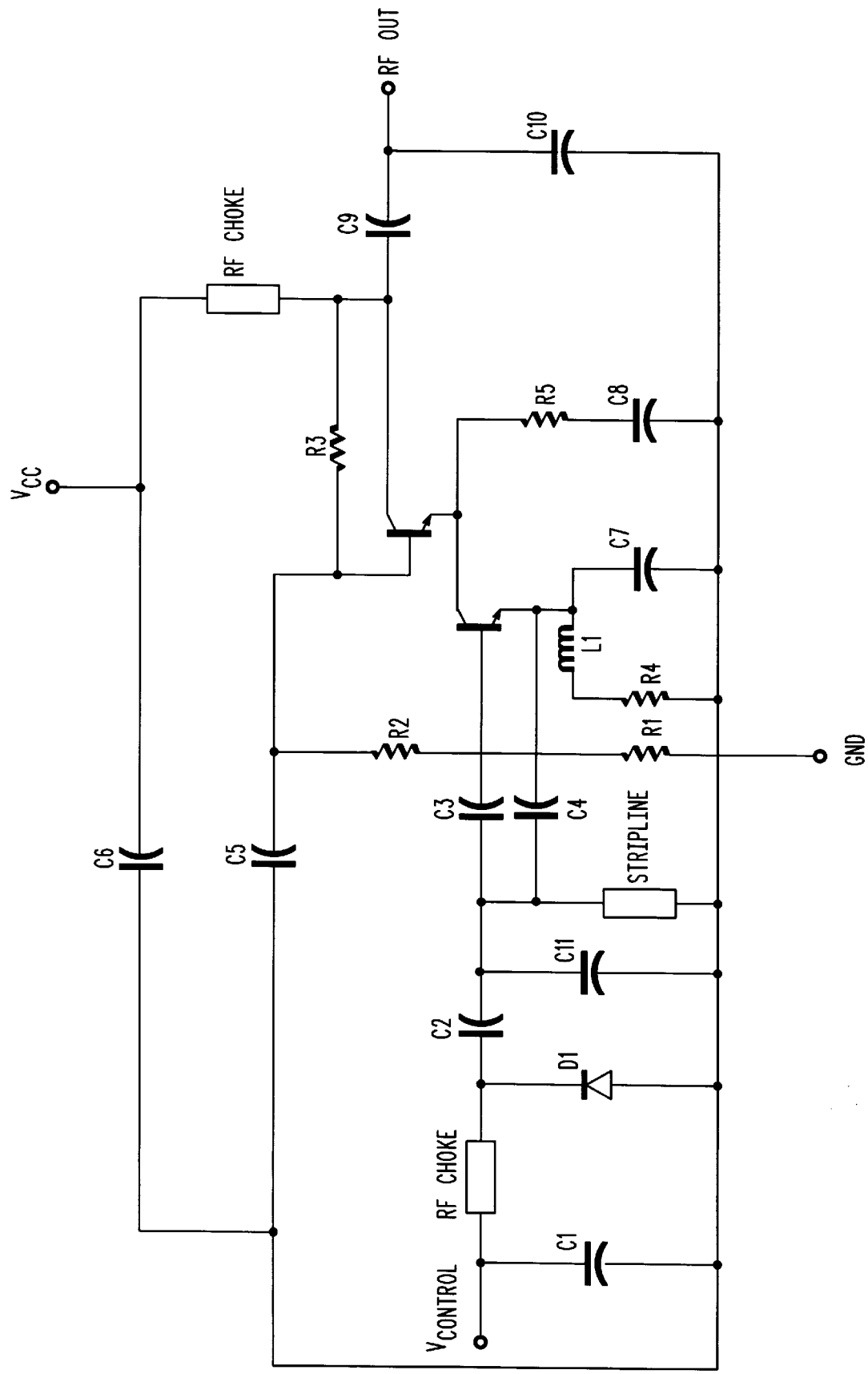
FIG. 10 is a schematic diagram of the VCO circuit of FIG. 4, in accordance with the present invention.

Referring to FIG. 4, a top view of a preferred embodiment of a voltage controlled oscillator circuit on a circuit board is shown. A microstrip resonator 20 is shown with several components on a circuit board 22. A schematic diagram of a preferred embodiment of the circuit is shown in FIG. 10. Typical values of the components are as follows:

| | |
|---|---|
| L1 = 27 nH | |
| R1 = 4.7 k ohm | R2 = 2.7 k ohm |
| R3 = 470 ohm | R4 = 68 ohm |
| C1 = 22 pF | C2 = 3.5 pF |
| C3 = 2.7 pF | C4 = 2.4 pF |
| C5 = 0.01 uF | C6 = 22 pF |
| C7 = 2.7 pF | C8 = 0.01 uF |
| C9 = 3.3 pF | C10 = 1.3 pF |

C11 = selected per frequency band
D1 = 1SV305 varactor
UPA808t NEC dual transistor Attaching a metal lid to the circuit board generally provides an upward frequency change in the operating frequency of the VCO, the magnitude of which is determined by the number, size and location of the apertures in the particular lid.

For example, an experiment was performed demonstrating the amount of frequency shift that can be obtained. Four tests were done and the actual results are as follows. The first test (baseline) measured the VCO operating frequency with no lid attached (as represented in FIG. 4) providing a center operating frequency of about 1750 MHz with a bandwidth of about 128 MHz. The second test measured the VCO nominal operating frequency with the first lid having no apertures (see FIG. 1) attached as shown in FIG. 6 which provided an operating frequency of about 1777 MHz, corresponding to a shift of +27 MHz. The third test measured the VCO nominal operating frequency with the second lid having one aperture (see FIG. 2) attached as shown in FIG. 7 which provided an operating frequency of about 1774 MHz, corresponding to a shift of +24 MHz. The fourth test measured the VCO nominal operating frequency with the first lid having no apertures (see FIG. 3) attached as shown in FIG. 8 which providing an operating frequency of about 1770 MHz, corresponding to a shift of +20 MHz.

As can be seen, different lids produce different frequency shifts ranging from +20 to +27 MHz at 1750 MHz, or about 7 MHz of tuning range (5.5% of bandwidth). This expansion of tuning range provided by the present invention is used advantageously to provide a passive frequency adjustment to obtain a desired VCO nominal operating frequency. In addition, the method described above can be used in conjunction with standard tuning techniques known in the art to provide an expanded frequency tuning range.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A method for tuning a voltage controlled oscillator by changing electrical circuit parasitics, comprising the steps of:
   providing a voltage controlled oscillator circuit on an upper side of a circuit board and a plurality of different metal lids each having different numbers, sizes and locations of apertures therethrough, each different lid presenting a different electrical circuit parasitic to the voltage controlled oscillator when attached to the circuit board;
   measuring an operating frequency of the voltage controlled oscillator;
   calculating an amount of frequency shift needed to achieve a desired nominal operating frequency;
   matching the amount of frequency shift needed to values in a look-up table of predetermined frequency shifts versus different lids to determine which lid parasitic will provide the proper amount of frequency shift needed; and
   attaching the lid indicated in the matching step to the upper side of the circuit board to at least partially cover the voltage controlled oscillator circuit such that the desired nominal operating frequency is achieved.

2. The method of claim 1, wherein in the attaching step the lids present a parasitic inductance parallel to a ground plane of the circuit board of the voltage controlled oscillator circuit which reduces the effective inductance of an LC resonator in the voltage controlled oscillator circuit raising the operating frequency.

3. The method of claim 1, wherein in the attaching step the lids present a parasitic capacitance to each node of the voltage controlled oscillator circuit which increases the effective capacitance of an LC resonator in the voltage controlled oscillator circuit lowering the operating frequency.

4. The method of claim 1, wherein in the attaching step the lids primarily present a parasitic inductance parallel to a ground plane of the circuit board of the voltage controlled oscillator circuit which reduces the effective inductance of an LC resonator in the voltage controlled oscillator circuit, and wherein the lids secondarily present a parasitic capacitance to each node of the voltage controlled oscillator circuit which increases the effective capacitance of an LC resonator in the voltage controlled oscillator circuit, resulting in an overall raising of the operating frequency.

5. The method of claim 1, wherein the attaching step includes coupling the lid to a ground plane of the circuit board.

6. The method of claim 5, wherein the attaching step includes a ground plane substantially covering a lower side of the circuit board.

7. The method of claim 1, wherein the providing step includes three different metal lids, a first lid being continuous with no apertures therethrough, a second lid with one aperture therethrough, and a third lid with two apertures therethrough.

8. The method of claim 7, wherein the providing step includes the second lid having a aperture of about 1 mm by 3.4 mm.

9. The method of claim 7, wherein the providing step includes the third lid having two apertures each about 1 mm by 3.4 mm.

10. The method of claim 1, where in the attaching step the lid presents a secondary parasitic capacitance to each node of the voltage controled oscillator circuit which increases the effective capacitance of an LC resonator in the voltage controlled oscillator circuit slightly lowering the operating frequency from that provided by the parasitic inductance of the lid.

11. The method of claim 1, wherein the attaching step includes coupling the lid to a ground plane of the circuit board.

12. The method of claim 1, wherein the providing step includes three different metal lids, a first lid being continuous with no apertures therethrough, a second lid with one aperture therethrough, and a third lid with two apertures therethrough.

13. The method of claim 12, wherein the providing step includes each aperture being about 1 mm by 3.4 mm.

14. The method of claim 1, wherein the providing step includes three different metal lids, a first lid being continuous with no apertures therethrough, a second lid with one aperture therethrough, and a third lid with two apertures therethrough.

15. The method of claim 14, wherein the providing step includes each aperture being about 1 mm by 3.4 mm.

16. A method for passively tuning a nominal operating frequency of a voltage controlled oscillator by changing electrical circuit parasitics, comprising the steps of:

providing a voltage controlled oscillator circuit on an upper side of a circuit board, a ground plane substantially covering a lower side of the circuit board, and a plurality of different metal lids each having different numbers, sizes and locations of apertures therethrough, each different lid primarily presenting a parasitic inductance parallel to the ground plane of the voltage controlled oscillator circuit when attached to the circuit board;

measuring an operating frequency of the voltage controlled oscillator;

calculating an amount of frequency shift needed to achieve a desired nominal operating frequency;

matching the amount of frequency shift needed to values in a look-up table of predetermined frequency shifts versus different lids to determine which lid parasitic will provide the proper amount of frequency shift needed; and attaching the lid indicated in the matching step to the upper side of the circuit board to at least partially cover the voltage controlled oscillator circuit such that the desired nominal operating frequency is achieved.

17. A method for passively tuning a nominal operating frequency of a voltage controlled oscillator by changing electrical circuit parasitics, comprising the steps of:

providing a voltage controlled oscillator circuit on an upper side of a circuit board, a ground plane substantially covering a lower side of the circuit board, and a plurality of different metal lids each having different numbers, sizes and locations of apertures therethrough, each different lid primarily presenting a parasitic inductance parallel to the ground plane of the voltage controlled oscillator circuit and secondarily presenting a parasitic capacitance to each node of the voltage controlled oscillator circuit when attached to the circuit board;

measuring an operating frequency of the voltage controlled oscillator;

calculating an amount of frequency shift needed to achieve a desired nominal operating frequency;

matching the amount of frequency shift needed to values in a look-up table of predetermined frequency shifts versus different lids to determine which lid parasitic will provide the proper amount of frequency shift needed; and attaching the lid indicated in the matching step to a ground connection of the circuit board to at least partially cover the voltage controlled oscillator circuit such that the desired nominal operating frequency is achieved.

* * * * *